United States Patent
Sung et al.

(10) Patent No.: US 7,713,823 B2
(45) Date of Patent: May 11, 2010

(54) SEMICONDUCTOR DEVICE WITH VERTICAL CHANNEL TRANSISTOR AND METHOD FOR FABRICATING THE SAME

(75) Inventors: Min-Gyu Sung, Ichon-shi (KR); Heung-Jae Cho, Ichon-shi (KR); Yong-Soo Kim, Ichon-shi (KR); Kwan-Yong Lim, Ichon-shi (KR); Se-Aug Jang, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/164,067

(22) Filed: Jun. 29, 2008

(65) Prior Publication Data

US 2009/0114981 A1    May 7, 2009

(30) Foreign Application Priority Data

Nov. 2, 2007    (KR) .................. 10-2007-0111632

(51) Int. Cl.
*H01L 21/8236*    (2006.01)
(52) U.S. Cl. .................. 438/272; 438/270; 438/589
(58) Field of Classification Search ........... 438/212, 438/268, 270, 272, 589
See application file for complete search history.

(56) References Cited

U.S. PATENT DOCUMENTS

| 6,787,458 | B1 | 9/2004 | Tripsas et al. | |
| 7,323,418 | B1 * | 1/2008 | Ngo et al. | 438/708 |
| 7,371,627 | B1 * | 5/2008 | Forbes | 438/197 |
| 2006/0097304 | A1 * | 5/2006 | Yoon et al. | 257/307 |
| 2006/0273370 | A1 | 12/2006 | Forbes | |
| 2007/0082448 | A1 * | 4/2007 | Kim et al. | 438/268 |

FOREIGN PATENT DOCUMENTS

| KR | 1020060041415 A | 5/2006 |
| KR | 100660881 B1 | 12/2006 |
| KR | 1020070047069 A | 5/2007 |
| KR | 100759839 B1 | 9/2007 |

* cited by examiner

*Primary Examiner*—Zandra Smith
*Assistant Examiner*—Christy L Novacek
(74) *Attorney, Agent, or Firm*—Townsend and Townsend and Crew LLP

(57) ABSTRACT

In a high speed vertical channel transistor, a pillar structure is formed over a substrate, a gate electrode surrounds an outer wall of a lower portion of the pillar structure; and a word line extends in a direction to partially contact an outer wall of the gate electrode. The word line shifts toward a side of the pillar structure resulting in increased transistor speed.

13 Claims, 10 Drawing Sheets

SEMICONDUCTOR DEVICE WITH VERTICAL CHANNEL TRANSISTOR AND METHOD FOR FABRICATING THE SAME

CROSS-REFERENCE TO RELATED APPLICATIONS

The present invention claims priority of Korean patent application number 10-2007-0111632, filed on Nov. 2, 2007, which is incorporated by reference in its entirety.

BACKGROUND OF THE INVENTION

The present invention relates to semiconductor device fabrication technology, and more particularly, to a semiconductor device with a vertical channel transistor and a method for fabricating a semiconductor device with a vertical channel transistor.

Recently, there has been an increasing need for sub-40 nm memory devices to increase the degree of integration. However, it is very difficult to realize a downscaled memory device having a line width of 40 nm or less using a typical planar or recessed gate transistor having an $8F^2$ or $6F^2$ cell architecture (where 'F' represents a minimum feature size). Therefore, dynamic random access memory (DRAM) devices having $4F^2$ cell architectures are now required since they improve the degree of integration by 1.5 to 2 times without scaling down. To this end, a vertical channel transistor has been suggested.

In a vertical channel transistor, a surround type gate electrode is formed to surround an active pillar that extends vertically on a semiconductor substrate, and source and drain regions are formed in upper and lower portions of the active pillar over and under the gate electrode, respectively, so that a channel is vertically formed. Therefore, even though the transistor area is reduced, the channel length can be maintained.

FIG. 1A illustrates a perspective view of a typical memory device including vertical channel transistors. FIG. 1B illustrates a plan view of a connection between a word line and a gate electrode in the typical memory device.

Referring to FIGS. 1A and 1B, a gate dielectric layer 13 and a gate electrode 14 surround an outer wall of a pillar 12 formed over a substrate 11. A storage node 15 is connected to an upper portion of the pillar 12, and a buried bit line 16 is provided in the substrate 11. A word line 18 is connected to the gate electrode 14 via a barrier metal 17, and extends in a direction so as to cross the bit line 16. An insulation layer 19 is formed between the storage node 15 and the gate electrode 14. The gate dielectric layer 13 may be formed between the substrate 11 and the gate electrode 14.

In the typical memory device, a polysilicon layer is used as the gate electrode 14, and a metal layer is used as the word line 18. Accordingly, a current flowing through the word line 18 is affected by the polysilicon layer used as the gate electrode 14 as well as the metal layer used as the word line 18 because the word line 18 and the gate electrode 14 are connected in series.

However, the current does not only flow through the word line 18; rather, it flows through both a small area of the gate electrode 14 and a large area of the word line 18 (see $I_1$ and $I_2$ of FIG. 1B). Therefore, a total sheet resistance ($R_S$) of the word line 18 dramatically increases due to the small area of the gate electrode 14, making it difficult to realize a high-speed memory device.

SUMMARY OF THE INVENTION

Embodiments of the present invention are directed to providing a semiconductor device including a vertical channel transistor that can realize high-speed performance by reducing a total resistance of a word line, and a method for fabricating the semiconductor device.

In accordance with an aspect of the present invention, there is provided a semiconductor device. The semiconductor device includes a pillar structure formed over a substrate, a gate electrode surrounding an outer wall of a lower portion of the pillar structure, and a word line extending in a direction to partially contact an outer wall of the gate electrode, the word line shifting toward a side of the pillar structure.

In accordance with another aspect of the present invention, there is provided a method for fabricating a semiconductor device. The method includes forming a pillar structure over a substrate, forming a gate electrode surrounding an outer wall of a lower portion of the pillar structure, and forming a word line extending in a direction to partially contact an outer wall of the gate electrode, the word line shifting toward a side of the pillar structure.

BRIEF DESCRIPTION OF THE DRAWINGS

FIGS. 3A to 3I illustrate a method for fabricating the semiconductor device in accordance with the embodiment of the present invention.

DESCRIPTION OF SPECIFIC EMBODIMENTS

Hereinafter, a semiconductor device including a vertical channel transistor and a method for fabricating a semiconductor device including a vertical channel transistor in accordance with the present invention are described in detail with reference to the accompanying drawings.

Figure 2A:
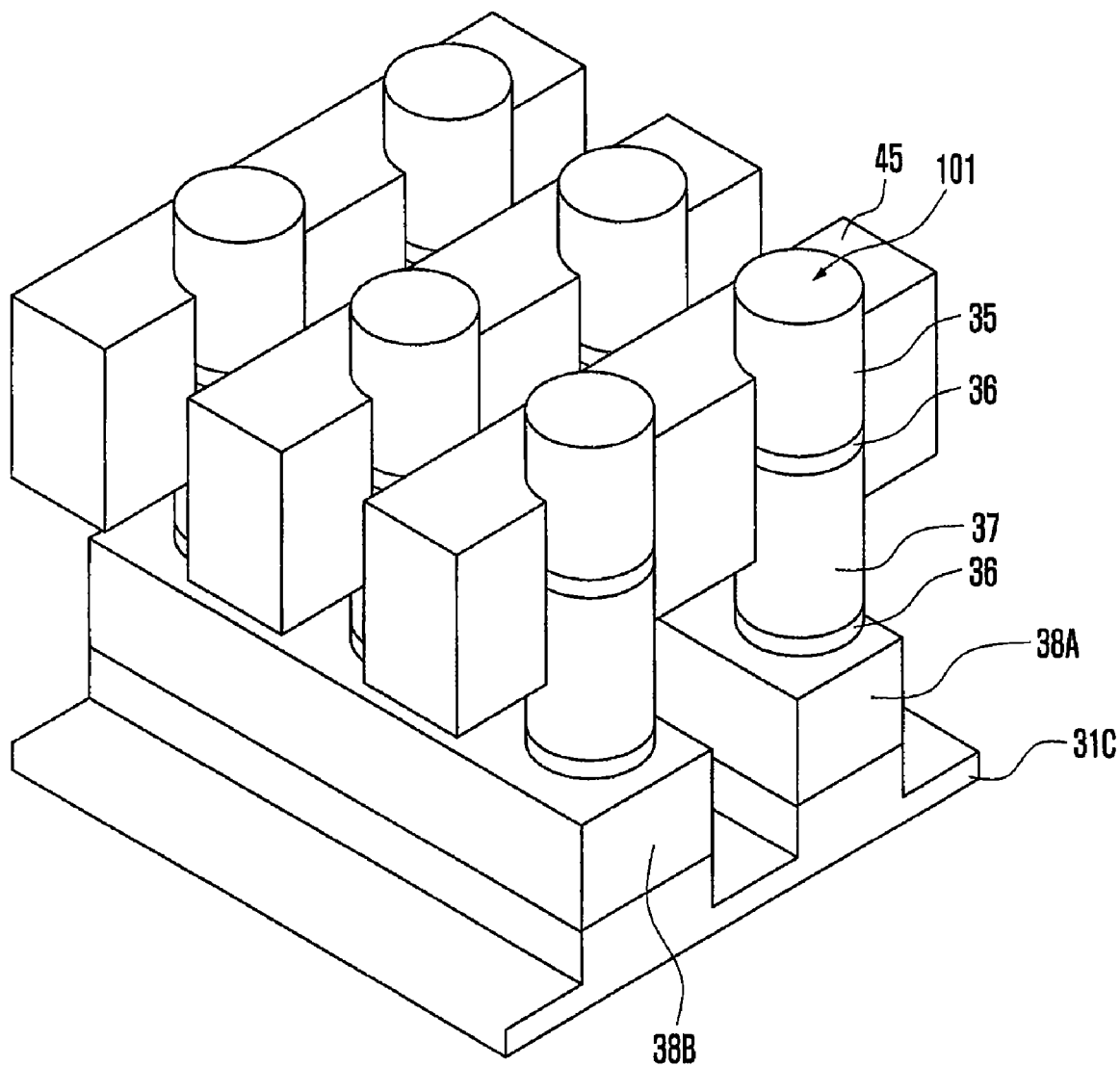
FIG. 2A illustrates a perspective view of a semiconductor device in accordance with an embodiment of the present invention.
Figure 2B:
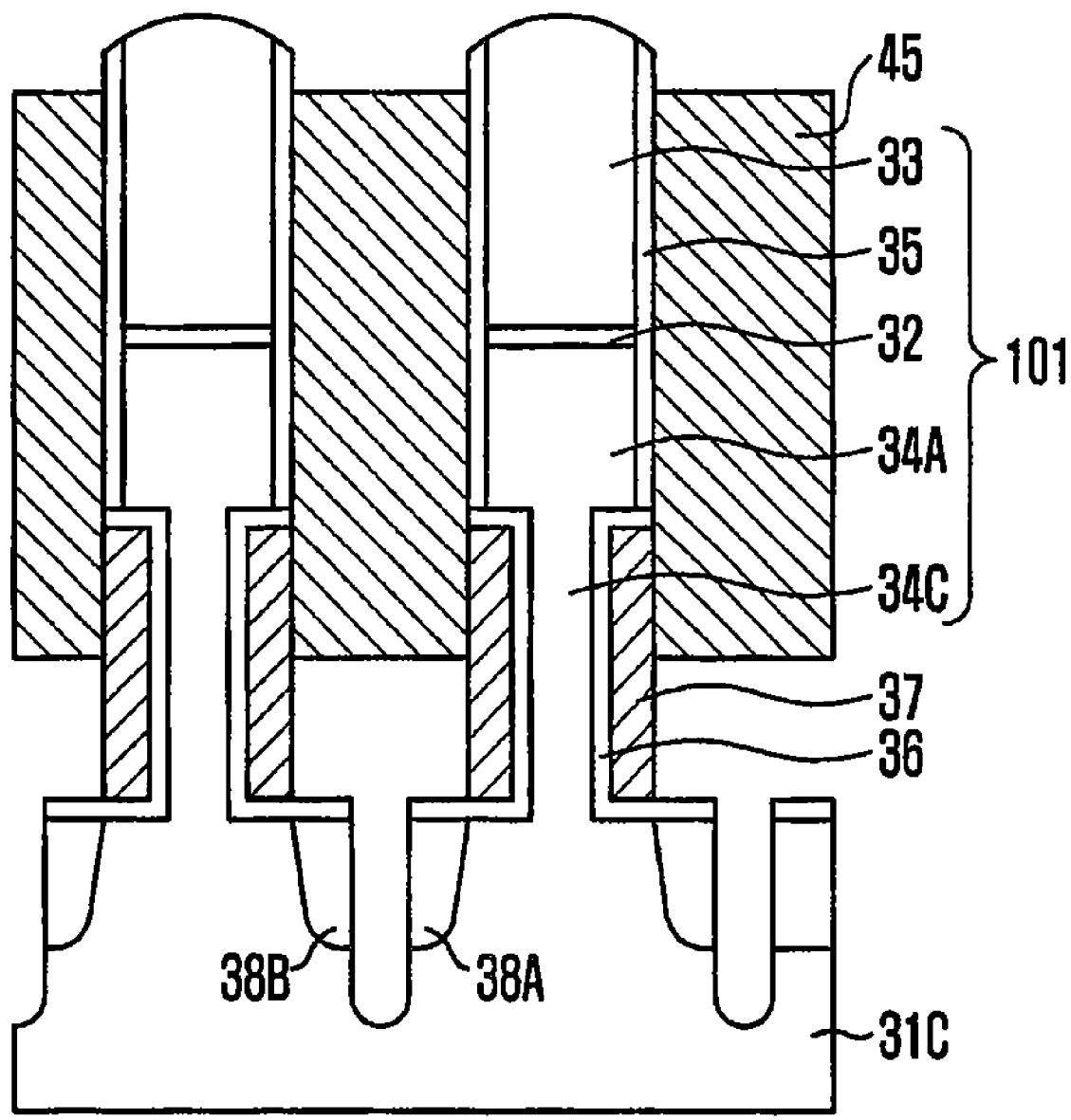
FIG. 2B illustrates a cross-sectional view of the semiconductor device in accordance with the embodiment of the present invention.
Figure 2C:
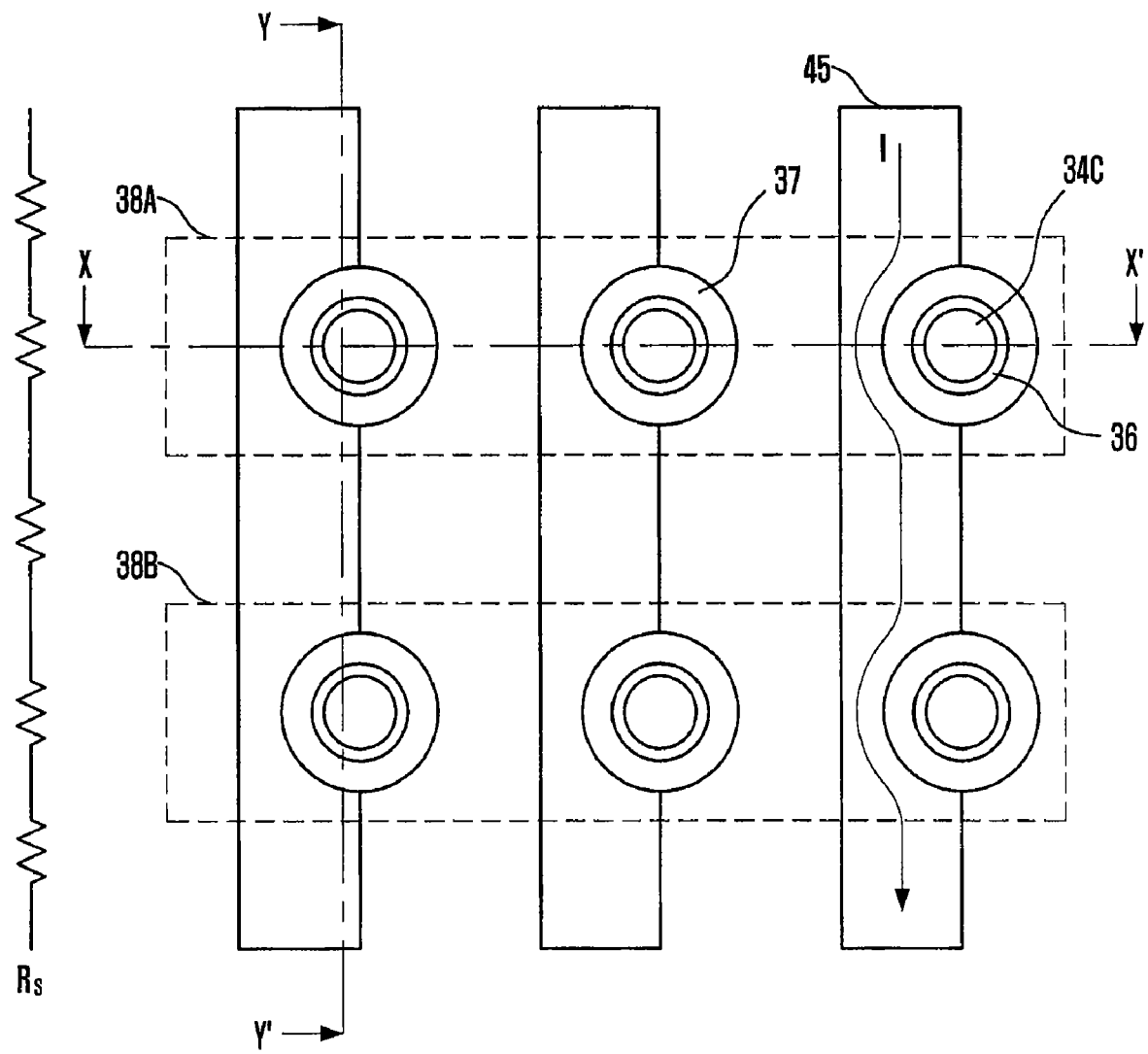
FIG. 2C illustrates a plan view of a connection between a word line and a gate electrode in the semiconductor device in accordance with the embodiment of the present invention.

FIG. 2A illustrates a perspective view of a semiconductor device in accordance with an embodiment of the present invention. FIG. 2B illustrates a cross-sectional view of the semiconductor device in accordance with the embodiment of the present invention. FIG. 2C illustrates a plan view of a connection between a word line and a gate electrode in the semiconductor device in accordance with the embodiment of the present invention. For convenience, an insulation layer or the like is omitted from the drawings.

Referring to FIGS. 2A to 2C, a plurality of pillar structures 101 are formed over a substrate 31C in the form of a matrix, and are separated from each other by a predetermined distance. The pillar structure 101 includes a body pillar 34C, a head pillar 34A, a buffer pattern 32 and a hard mask pattern 33, which are formed over the substrate 31C. Here, the head pillar 34A has a width greater than the body pillar 34C. An upper sidewall of the pillar structure 101 is covered with a capping layer 35.

A gate dielectric layer 36 is formed over surfaces of the body pillar 34C and the substrate 31C, and a gate electrode 37 is formed over the gate dielectric layer 36 to surround the body pillar 34C. Hence, the gate electrode 37 may be a surround type structure surrounding an outer wall of the body pillar 34C formed at a lower portion of the pillar structure 101. Buried bit lines 38A and 38B are provided in the substrate 31C by implanting impurities into the substrate 31C.

The word line 45 partially contacts an outer wall of the gate electrode 37, and extends in a direction so as to cross the bit lines 38A and 38B provided in the substrate 31C. That is, the word line 45 extends so as to partially contact all of the respective gate electrodes 37. To partially contact all of the gate electrodes 37, the word line 45 shifts toward a side of the pillar structure 101.

The gate electrode 37 may include a polysilicon layer, and the word line 45 may include a metal layer. The word line 45 may include tungsten silicide ($WSi_x$), titanium nitride (TiN), tungsten (W), aluminum (Al), copper (Cu), gold (Au), ruthenium (Ru), or a combination thereof. The memory device including the vertical channel transistor may further include a barrier metal between the gate electrode 37 and the word line 45. The barrier metal may include TiN, tantalum carbonitride (TaCN), tantalum carbide (TaC), tungsten nitride (WN), tungsten silicon nitride (WSiN), tantalum nitride (TaN), titanium (Ti), tungsten silicide ($WSi_x$), or a combination thereof.

As illustrated in FIGS. 2A to 2C, the word line 45 is shaped such that it shifts toward a side of the pillar structure 101. If the word line 45 shifts toward a side of the pillar structure 101, the word line 45 and the gate electrode 37 are not connected in series. Therefore, a current I flowing through the word line 45 is mainly affected by the metal layer used as the word line 45. That is, although the current I may be somewhat affected by the gate electrode 37, the word line 45 has a metal-to-metal connection scheme so that the current I is mostly affected by the large area of the word line 45. Such a scheme minimizes the effect of the gate electrode 37, maximizes the effect of the word line 45 made of a metal, and thus remarkably reduces a total resistance (Rs) of the word line 45.

Figure 1A:
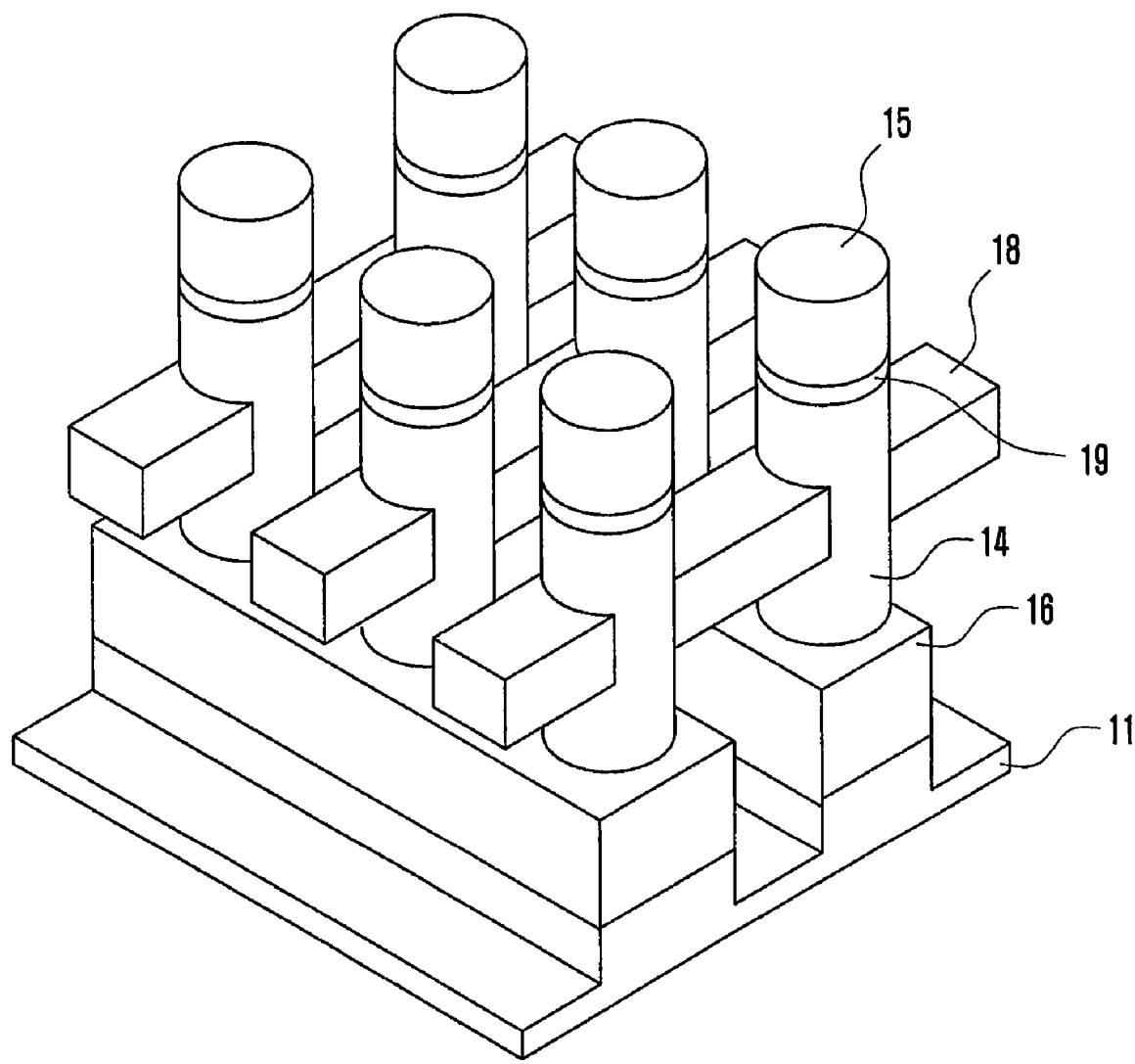
FIG. 1A illustrates a perspective view of a typical memory device having vertical channel transistors.
Figure 1B:
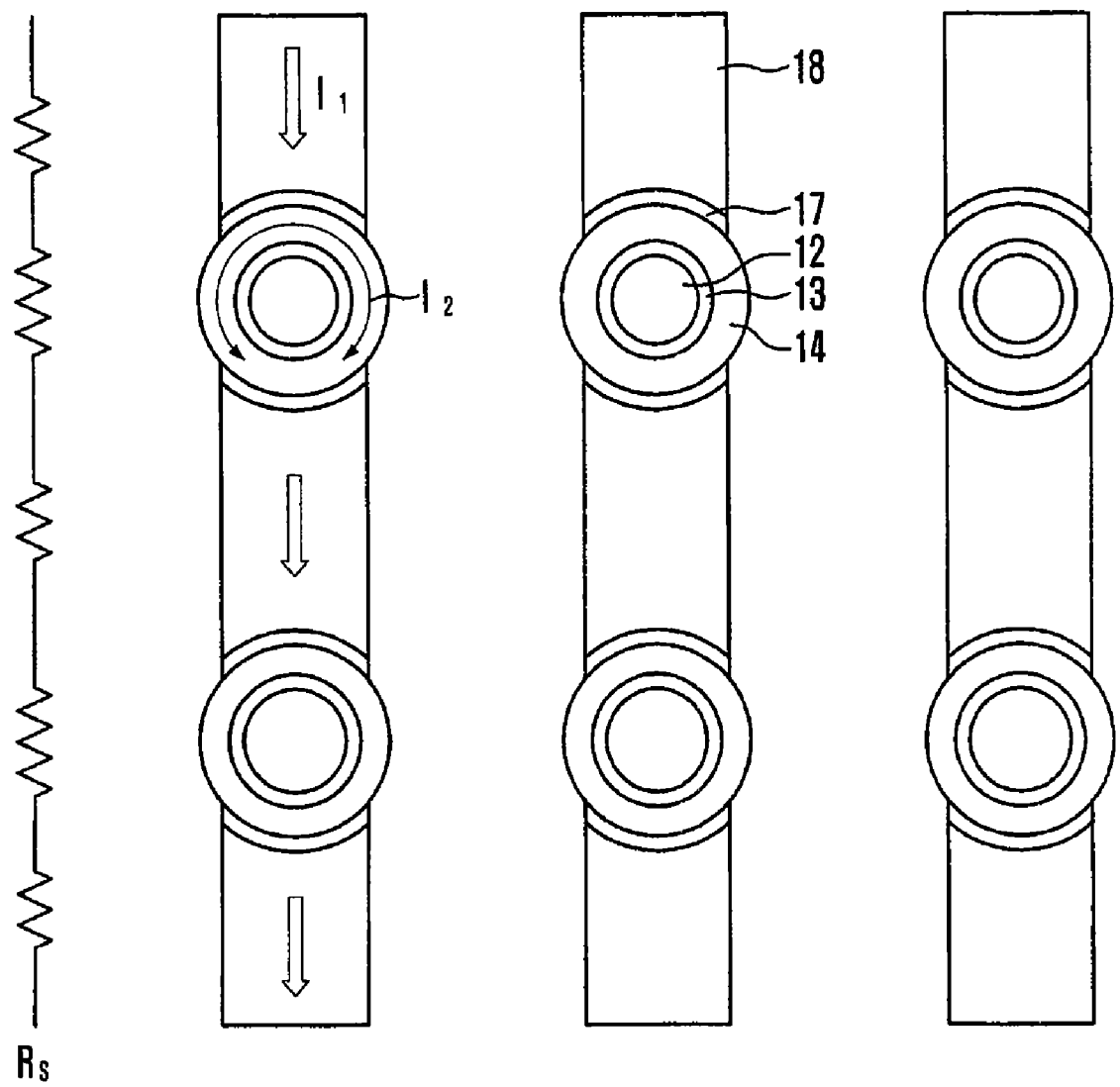
FIG. 1B illustrates a plan view of a connection between a word line and a gate electrode in the typical memory device.

In comparison with the typical memory device of FIG. 1B, the total resistance (Rs) of the word line 45 of the semiconductor device in accordance with the present invention can be reduced to approximately 1/10th the total resistance of the word line 18 by reducing the area of the gate electrode 37 and increasing the area of the word line 45. In detail, the total resistance of the word line 18 is affected by the connection of the word line 18 of a metal layer and the gate electrode 14 of a polysilicon layer in the typical memory device, whereas the total resistance (Rs) of the word line 45 is mainly determined by the word line 45 of a metal layer in the memory device of the present invention. Therefore, the total resistance of the word line 45 can be reduced, making it easy to realize a high speed memory device.

FIGS. 3A to 3I illustrate a method for fabricating a semiconductor device in accordance with an embodiment of the present invention. For the sake of convenience, FIGS. 3A to 3I illustrate—in the same view—a cross-sectional view taken along line Y-Y' and a cross-sectional view taken along line X-X'.

Figure 3A:
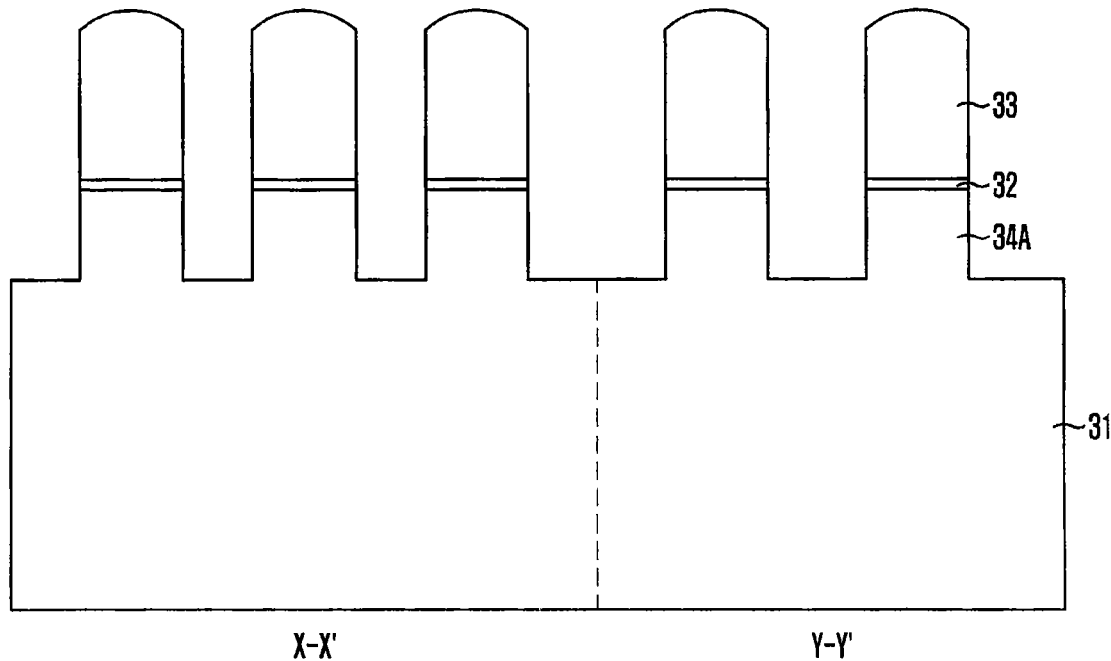

Referring to FIG. 3A, a buffer pattern 32 and a hard mask pattern 33 are formed over a substrate 31. The buffer pattern 32 may be formed of silicon oxide ($SiO_2$) to a thickness ranging from approximately 50 Å to 150 Å through thermal oxidation. The hard mask pattern 33 is formed of a material which may be selectively etched with respect to the buffer pattern 32 and the substrate 31. For example, the hard mask pattern 33 may be formed of silicon nitride ($Si_3N_4$) or silicon carbide (SiC). The hard mask pattern 33 may formed to a thickness of approximately 2,000 Å.

The substrate 31 is primarily etched to a predetermined depth, e.g., approximately 1,100 Å, using the hard mask pattern 33 as an etch barrier. Hereinafter, this primary etching will be referred to as 'first pillar etching'. Through the first pillar etching, a head pillar 34A—which serves as an active region—is formed. Preferably, etching the substrate 31 to form the head pillar 34A is performed via an anisotropic dry etching process using chlorine ($Cl_2$) gas soley, hydrogen bromide (HBr) gas solely, or a gas mixture of $Cl_2$ gas and HBr gas.

Figure 3B:
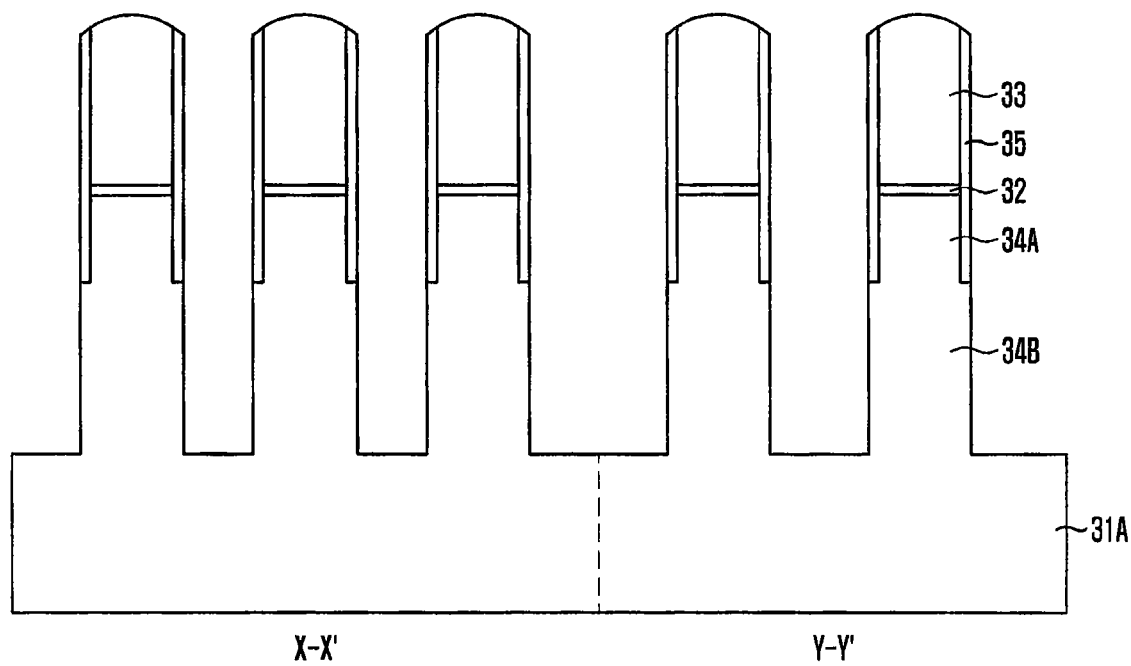

Referring to FIG. 3B, a capping layer 35 is formed over the resultant structure. The capping layer 35 may be formed by depositing a nitride layer solely or depositing an oxide layer and a nitride layer in sequence. The oxide layer may include a silicon oxide ($SiO_2$) layer, and the nitride layer may include a silicon nitride ($Si_3N_4$) layer. A straight etching, e.g., etch-back, is performed to leave the capping layer 35 on a sidewall of the head pillar 34A and to expose a surface of the substrate 31 between the head pillars 34A. The capping layer 35 also remains on sidewalls of the hard mask pattern 33 and the buffer pattern 32 after the straight etching. The capping layer 35 protects the sidewall of the head pillar 34A from being negatively affected by a subsequent process. The capping layer 35 may be formed to a thickness ranging from approximately 50 Å to 100 Å.

The exposed substrate 31 is secondarily etched to a predetermined depth, e.g., approximately 2,000 Å, using the capping layer 35 and the hard mask pattern 33 as an etch barrier. Hereinafter, this etching will be referred to as 'second pillar etching'. The second pillar etching is also performed through straight etching to thereby form a body pillar 34B under the head pillar 34A. The body pillar 34B may have a height greater than the head pillar 34A. Preferably, the second pillar etching of the substrate 31 to form the body pillar 34B is performed via an anisotropic dry etching process using $Cl_2$ gas solely, HBr gas solely, or a gas mixture of $Cl_2$ gas and HBr gas. The primarily etched substrate after forming the body pillar 34B is indicated by reference numeral 31A. After the second pillar etching is completed, the body pillar 34B having a predetermined height is formed over the substrate 31A.

Figure 3C:
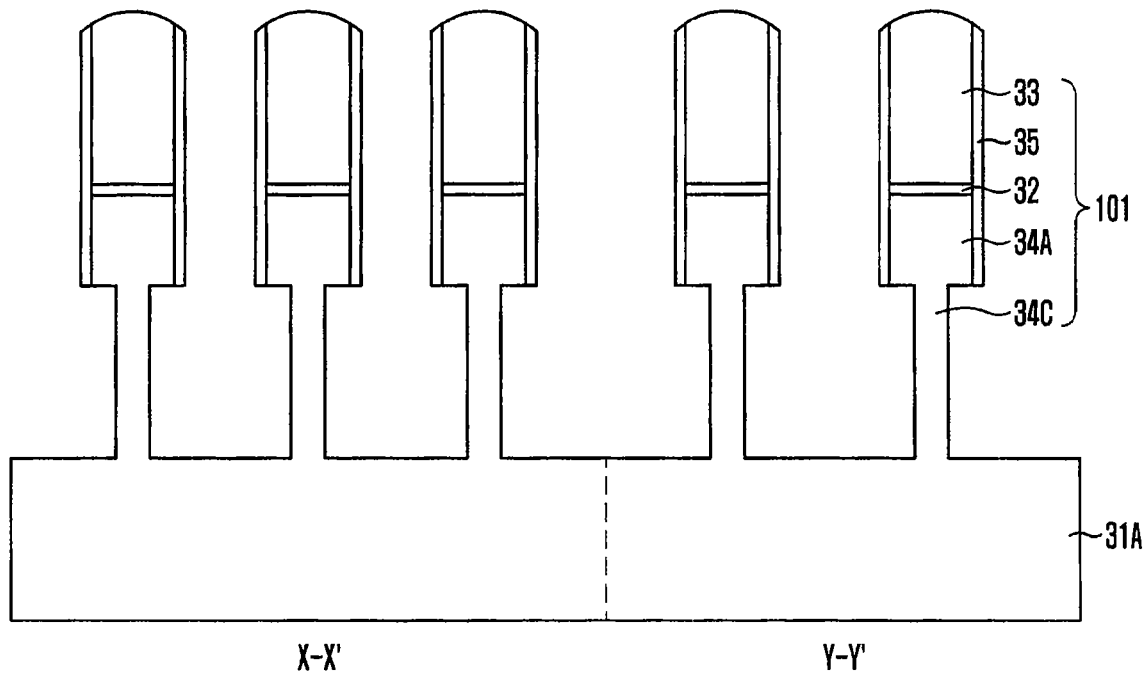

Referring to FIG. 3C, a third pillar etching is performed to isotropically etch the sidewall of the body pillar 34B. The isotropic third pillar etching is performed via a wet etching or chemical dry etching (CDE) process.

Such an isotropic etching is called a pillar trimming process. During the isotropic etching, only the exposed sidewall of the body pillar 34B is etched by approximately 150 Å, whereas the head pillar 34A covered with the capping layer 35 is not etched.

Therefore, the body pillar 34C is isotropically etched and the head pillar 34A on the body pillar 34C forms a T-shaped pillar structure. Specifically, the body pillar 34C will be surrounded by a gate electrode to be formed later, and the head pillar 34A covered with the capping layer 35 will be connected to a storage node.

Through the above-described etching processes, a pillar structure 101 is formed, which includes the head pillar 34A and the body pillar 34C. That is, the pillar structure 101 includes a first region, a second region under the first region, and a capping layer covering the sidewall of the first region. Herein, the second region has a width smaller than the first region. The second region corresponds to the body pillar 34C, and the first region corresponds to a multi-layered structure of the head pillar 34A, the buffer pattern 32, and the hard mask pattern 33.

Figure 3D:
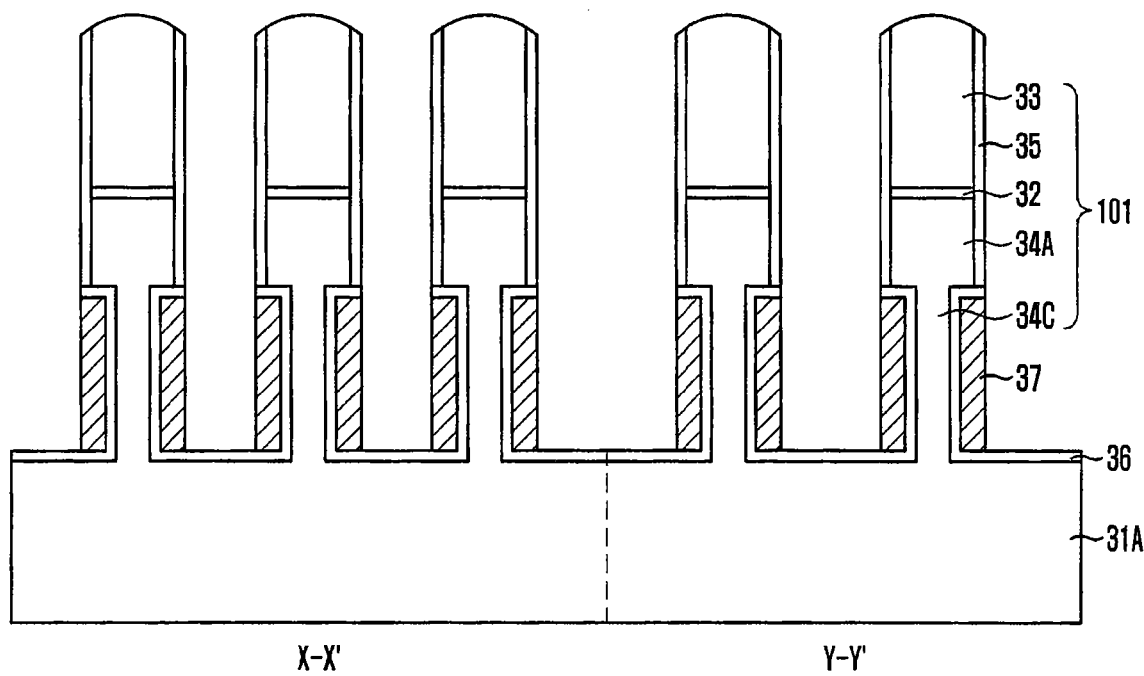

Referring to FIG. 3D, a gate dielectric layer 36 is formed over exposed surfaces of the substrate 31A and the body pillar 34C. The gate dielectric layer 36 may include a silicon oxide layer, and the gate dielectric layer 36 may be formed to approximately 50 Å thick via a deposition or oxidation process.

A gate electrode 37 is formed to surround the sidewall of the body pillar 34C having the gate dielectric layer 36 formed thereon. In detail, the gate electrode 37 is formed in such a manner that a conductive layer is deposited on an entire surface of the substrate 31A, and thereafter an etchback process is performed until the gate dielectric layer 36 on the substrate 31A between pillar structures 101 is exposed. The gate electrode 37 may include a polysilicon layer doped with n-type impurities or p-type impurities.

Figure 3E:
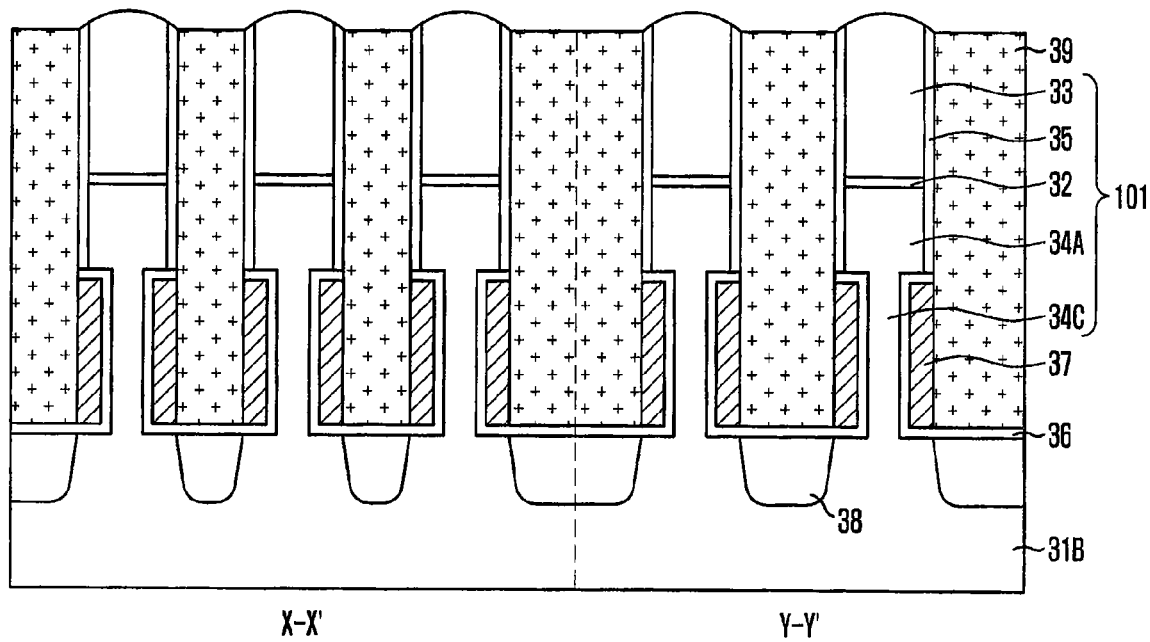

Referring to FIG. 3E, impurities such as phosphor (P) and arsenide (As) are implanted into the substrate 31A between the pillar structures 101 to form an impurity region 38 in the substrate 31A. The impurity region 38 is a region where a buried bit line will be formed.

A first interlayer dielectric (ILD) layer 39 is formed over the resulting structure to fill a space between the pillar structures 101. The first ILD layer 39 may be formed of boron phosphorus silicate glass (BPSG) which exhibits excellent gap-fill properties. After forming the first ILD layer 39, a chemical mechanical polishing (CMP) may be performed to remove a stepped portion until the surface of the hard mask pattern 33 is exposed. Reference numeral 31B denotes the substrate after the impurity region 38 is formed therein by ion implantation.

Figure 3F:
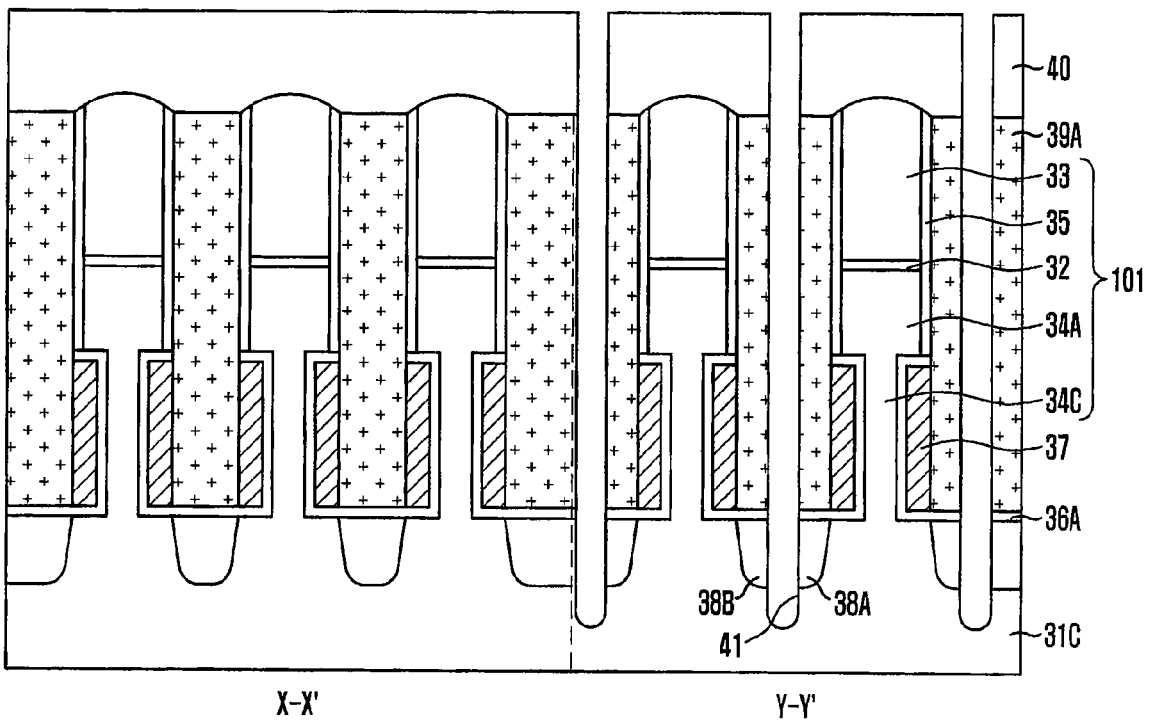

Referring to FIG. 3F, a first photoresist pattern 40 having spaced lines is formed to expose a space between the pillar structures 101 arranged in the Y-Y' direction. The pillar structures 101 arranged in the X-X' direction are covered with the first photoresist pattern 40.

The first ILD layer 39 and the gate dielectric layer 36 are etched using the first photoresist pattern 40, and the substrate 31B is successively etched to a depth allowing the impurity regions 38 to be isolated from each other, thereby forming a first trench 41.

The impurity regions 38 are isolated by the first trench 41 so that bit lines 38A and 38B are formed. These bit lines 38A and 38B are buried in the substrate 31B, and thus are called buried bit lines. The gate dielectric layer 36 serves as a gate dielectric and also serves a role of electrically insulating the gate electrode 37 from the bit lines 38A and 38B. The bit lines 38A and 38B extend in a direction perpendicular to the gate electrode 37, and are arranged in a direction perpendicular to the Y-Y' direction. Reference numerals 31C, 36A and 39A represent the substrate secondarily etched through the etching process of forming the first trench 41, the etched gate dielectric layer, and the primarily etched first ILD layer, respectively.

Figure 3G:
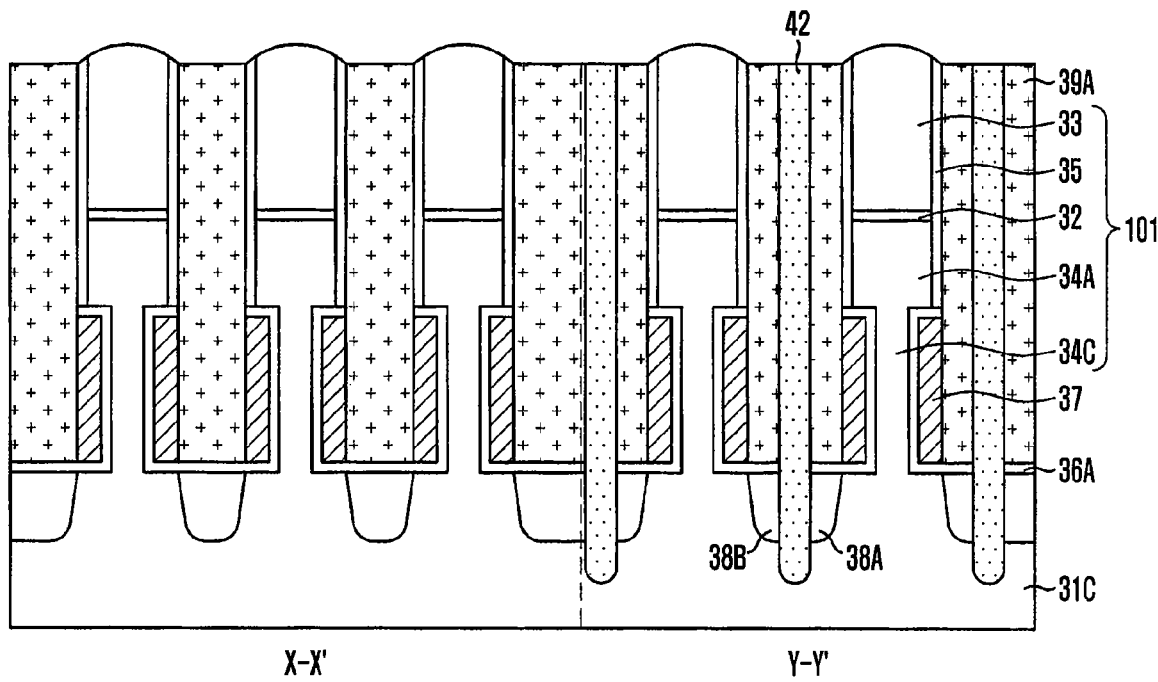

Referring to FIG. 3G, the first photoresist pattern 40 is removed, and a second ILD layer 42 is then deposited over the resulting structure so as to gap-fill the first trench 41. Herein, the second ILD layer 42 may be formed of BPSG which exhibits excellent gap fill properties, and serves as an insulation layer between neighboring pillars 34C and between neighboring bit lines 38A and 38B. The second ILD layer 42 is planarized to expose the surface of the pillar structure 101.

Figure 3H:
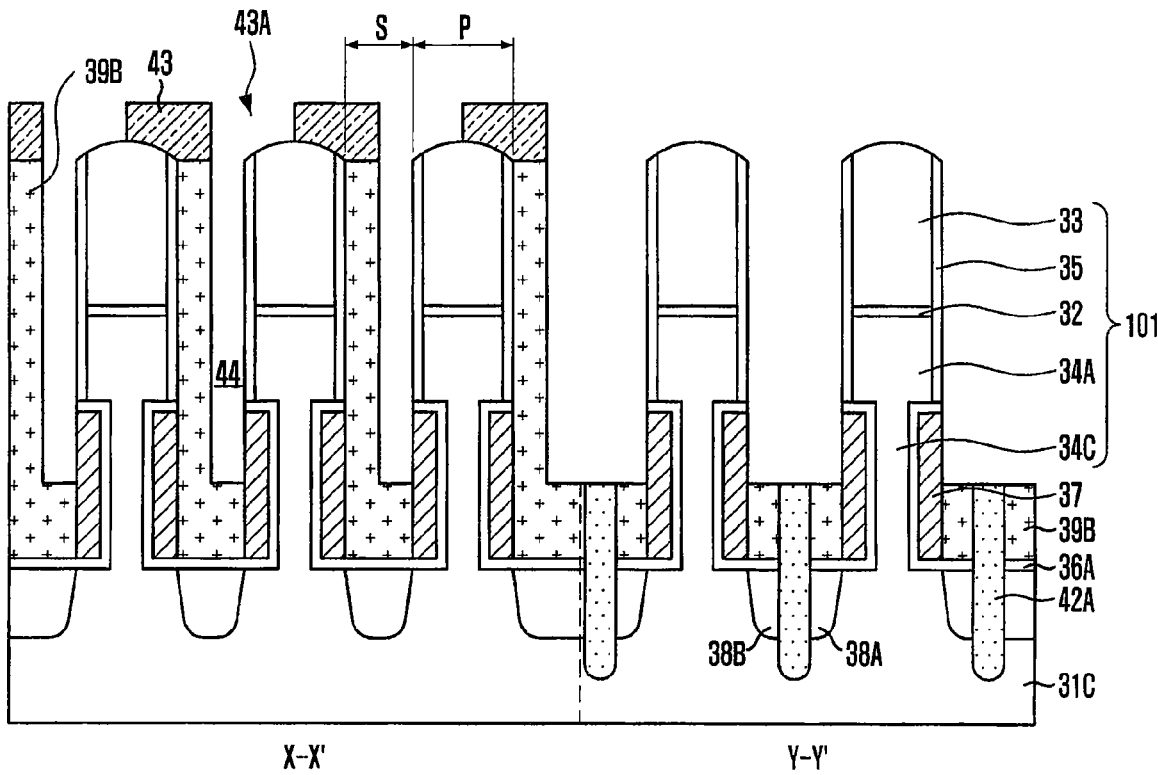
Figure 31:
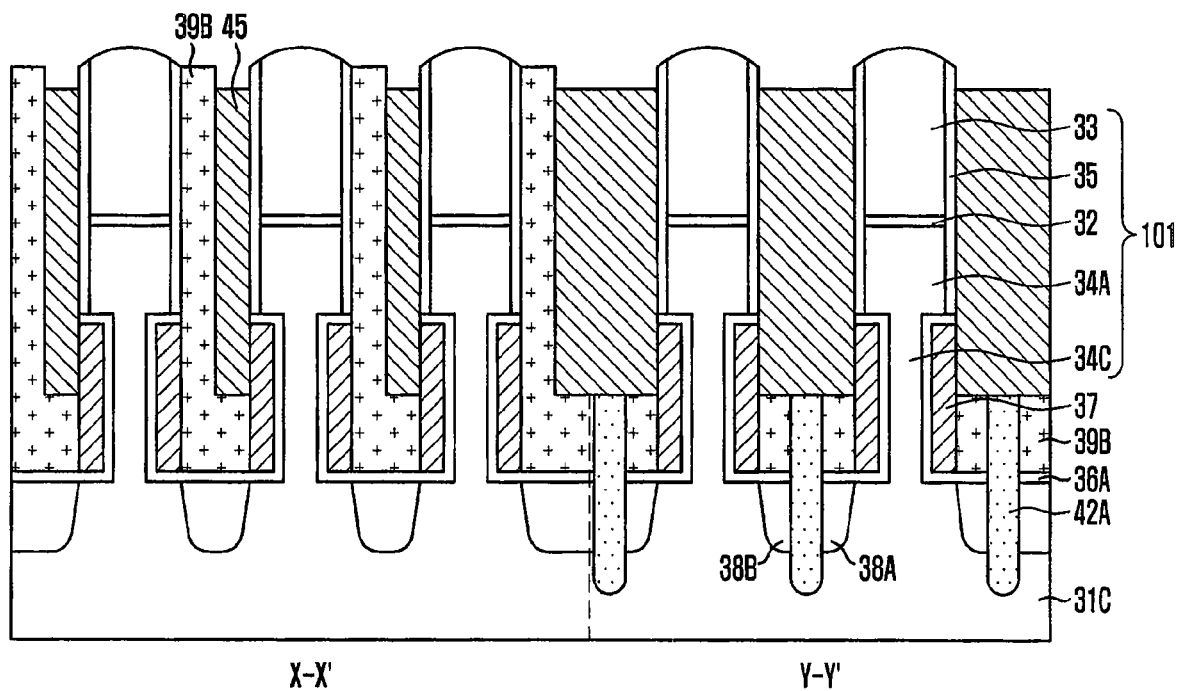

Referring to FIG. 3H, a second photoresist pattern 43 having spaced lines is formed to expose the pillar structures 101 in the X-X' direction. The second photoresist pattern 43 exposes the first and second ILD layers 39 and 42 between the pillar structures 101 as well as a top surface (i.e., the top surface of the hard mask pattern) of the pillar structure 101 in the Y-Y' direction.

The second photoresist pattern 43 is formed such that it shifts toward a side of the pillar structure 101 in the X-X' direction. For example, the second photoresist pattern 43 includes an opening defining a second trench 44. One side of the opening is aligned with the center of the pillar structure 101, and the other side of the opening is aligned with the center of a region between two pillar structures 101. That is, when assuming that a width of the pillar structure 101 is P and a distance between two pillar structures 101 is S when the pillar structures 101 are arranged in the X-X' direction, the opening 43A opened by the second photoresist pattern 43 is formed in the shape of a line such that it simultaneously exposes the area corresponding to approximately one half of P (i.e., P/2), and the area corresponding to approximately one half of S (i.e., S/2). Alternatively, the opening 43A may not be aligned with the center. That is, the opening may be variously shaped as long as the word line 45 shifts in one direction to partially contact an outer wall of the gate electrode 37.

A partial etching is performed using the second photoresist pattern 43, thereby leaving portions of the primarily etched first ILD layer 39A and the second ILD layer 42 between the pillar structures 101. For example, the partial etching is performed to leave the primarily etched first ILD layer 39A and the second ILD layer 42 to be lower than the top surface of the gate electrode 37. The partial etching is performed via a dry etching process. The remaining first ILD layer and second ILD layer after the partial etching are represented as 'secondarily etched first ILD layer 39B' and 'etched second ILD layer 42A', respectively. As a result of the partial etching, the primarily etched first ILD layer 39A is partially etched in the X-X' direction so that the secondarily etched first ILD layer 39B partially fills the space between the pillar structures 101 while covering a sidewall at one side of the pillar structure 101. In the Y-Y' direction, the primarily etched first ILD layer 39A and the second ILD layer 42 are partially etched at the same time so that the secondarily etched first ILD layer 39B and the etched second ILD layer 42A remain to partially fill the space between the pillar structures 101.

As a result of the partial etching, the second trench 44 is formed to expose an upper portion of the outer wall of the gate electrode 37. For example, the second trench 44 exposes approximately two-thirds of the gate electrode 37.

Referring to FIG. 3I, the second photoresist pattern 43 is removed, and then a word line 45 is formed such that it partially fills the second trench 44 and is electrically connected to the gate electrode 37. The word line 45 is formed by depositing a metal layer and then recessing (e.g., etching back) a portion of the metal layer. The word line 45 extends to shield the gate electrode 37. Preferably, the metal layer used as the word line 45 includes $WSi_X$, TiN, W, Al, Cu, Au, Ru, or a combination thereof. The metal layer may be deposited via an atomic layer deposition (ALD) process, a physical vapor deposition (PVD) process, or a chemical vapor deposition (CVD) process. A barrier metal may be further formed between the word line 45 and the gate electrode 37. The barrier metal includes TiN, TaCN, TaC, WN, WSiN, TaN, Ti, $WSi_X$, or a combination thereof.

The word line 45 is in contact with a portion of an outer wall of the gate electrode 37 and is arranged to perpendicularly cross the bit lines 38A and 38B.

In accordance with the previous embodiments, the word line 45 has a metal-to-metal connection scheme so that a total resistance of the word line 45 is mainly affected by the metal layer used as the word line 45 and only minimally affected by the gate electrode 37. Accordingly, the total resistance of the word line 45 is reduced.

The present invention is also applicable to nonvolatile memory devices with a vertical channel transistor, for example, flash memories, SONOS memories, or TANOS memories, as well as DRAMs.

As described above, in accordance with the present invention, the word line 45 has a metal-to-metal connection scheme, thus effectively reducing a total resistance of the word line 45. This is advantageous in realizing high speed memory devices.

Further, since the word line 45 occupies half the space between the pillar structures 101, only a portion corresponding to half the width of the word line 45—instead of two gate electrodes 14—contributes to electrical conductivity. As a result, it is possible to reduce the resistance of the word line 45 to approximately 1/10th the total resistance of the word line 18 of the typical memory device strongly affected by the gate electrode 14.

While the present invention has been described with respect to specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for fabricating a semiconductor device, the method comprising:
   forming a plurality of pillar structures over a substrate;
   forming a gate electrode surrounding an outer wall of a lower portion of each of the pillar structures; and
   forming a word line extending in a direction to partially contact only a half of an outer wall of each gate electrode, wherein the word line is shifted toward a side each of the pillar structures.

2. The method of claim 1, wherein each gate electrode comprises a silicon layer.

3. The method of claim 1, wherein each word line comprises one material selected from the group consisting of $WSi_x$, TiN, W, Al, Cu, Au and Ru.

4. The method of claim 1, further comprising forming a barrier metal between each gate electrode and each word line.

5. The method of claim 4, wherein the barrier metal comprises one material selected from the group consisting of TiN, TaCN, TaC, WN, WSiN, TaN, Ti, and $WSi_x$.

6. The method of claim 1, wherein each pillar structure comprises:
   a body pillar; and
   a head pillar formed over the body pillar, and having a width greater than the body pillar,
   wherein the gate electrode surrounds an outer wall of the body pillar with a gate dielectric layer interposed therebetween.

7. The method of claim 6, wherein the forming of the plurality of pillar structures comprises:
   forming a hard mask pattern over the substrate;
   primarily etching the substrate using the hard mask pattern as an etch barrier to form the head pillar of each pillar structure;
   forming a capping layer on a sidewall of the head pillar of each pillar structure;
   secondarily etching the substrate using the capping layer as an etch barrier to form the body pillar of each pillar structure; and
   thirdly etching a sidewall of the body pillar of each pillar structure laterally by a predetermined width.

8. The method of claim 7, wherein the primary etching of the substrate and the secondary etching of the substrate are performed through anisotropic etching, and the third etching is performed through isotropic etching.

9. The method of claim 1, further comprising forming a bit line buried in the substrate between adjacent pillar structures.

10. The method of claim 9, wherein forming the bit line comprises:
    implanting impurities into the substrate between the adjacent pillar structures to form an impurity region to be used as the bit line;
    forming a trench isolating the impurity region; and
    filling the trench with a dielectric layer.

11. The method of claim 9, further comprising forming a gate dielectric layer between each pillar structure and the corresponding gate electrode, the gate dielectric layer also being formed between each gate electrode and the corresponding bit line.

12. The method of claim 9, wherein the forming of the word line comprises:
    forming an internal dielectric (ILD) layer filling a space between the adjacent pillar structures;
    etching the ILD layer to form a trench partially exposing the outer wall of each gate electrode arranged in a direction crossing the bit line;
    filling the trench with a metal layer; and
    performing an etchback process on the metal layer to have a top surface higher than a top surface of each gate electrode.

13. The method of claim 12, wherein the etching of the ILD layer is performed using a photoresist pattern having an opening defining the trench,
    the photoresist pattern being a line-space shaped pattern where one side of the opening is aligned with the center of each pillar structure and the other side of the opening is aligned with the center of a region between the adjacent pillar structures.

* * * * *